(12) United States Patent
Iwasaki et al.

(10) Patent No.: US 6,943,076 B2
(45) Date of Patent: Sep. 13, 2005

(54) SEMICONDUCTOR DEVICE AND METHOD OF MANUFACTURING THE SAME

(75) Inventors: Tomio Iwasaki, Tokyo (JP); Hideo Miura, Tokyo (JP); Hiroyuki Ohta, Tokyo (JP); Hiroshi Moriya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,843

(22) Filed: Aug. 30, 2001

(65) Prior Publication Data

US 2002/0094633 A1 Jul. 18, 2002

(30) Foreign Application Priority Data

Jan. 16, 2001 (JP) ........................................ 2001-008301

(51) Int. Cl.[7] ............................................ H01L 21/336
(52) U.S. Cl. ...................... 438/216; 438/287; 438/592; 438/591
(58) Field of Search ................................. 438/216, 287, 438/592, 591, FOR 193, FOR 202

(56) References Cited

U.S. PATENT DOCUMENTS

| 6,171,910 B1 * | 1/2001 | Hobbs et al. ............... 438/275 |
| 2001/0023120 A1 * | 9/2001 | Tsunashima et al. ........ 438/585 |
| 2001/0044205 A1 * | 11/2001 | Gilbert et al. .............. 438/653 |

FOREIGN PATENT DOCUMENTS

| JP | 07-263572 | 10/1995 |
| KR | 1997-13325 | 3/1997 |
| KR | 2000-14388 | 3/2000 |

OTHER PUBLICATIONS

Kohji Matsuo, et al., "Reliable High–k $TiO_2$ Gate Insulator Formed by Ultrathin TiN Deposition and Low Temperature Oxidation," *1999 International Conference on Solid State Devices and Materials*, pp. 164–165.

Benito deCelis, et al., "Molecular Dynamics Simulation of Crack Tip Processes in Alpha–iron and Copper," *J. Appl. Phys.* (Sep. 1983), 54(9):4864–78.

Thomas Kwok, et al., "Molecular–dynamics Studies of Grain–boundary Diffusion," *Physical Review B* (May 15, 1984), 29:5363–71.

S.A. Campbell, et al., "Titanium Dioxide ($TiO_2$)–based Gate Insulators," *IBM J. Res. Develop.* (May 1999). 43(3):383–91.

* cited by examiner

*Primary Examiner*—George Fourson
(74) *Attorney, Agent, or Firm*—Townsend and Townsend and Crew, LLP

(57) ABSTRACT

Gate insulation films each containing titanium oxide as a primary constituent material are formed on one major surface of a semiconductor substrate. Gate electrode films are formed in contact with the gate insulation films. The gate electrode films contain ruthenium oxide or alternatively iridium oxide as a primary constituent material. In order to prevent electrically conductive elements from diffusing into titanium oxide of the gate insulation films, ruthenium oxide or iridium oxide is effectively used as a primary constituent material of the gate electrodes. A semiconductor device can be realized in which occurrence of a leak current is suppressed by increasing a physical film thickness while sustaining desired dielectric characteristic.

11 Claims, 6 Drawing Sheets

US 6,943,076 B2

SEMICONDUCTOR DEVICE AND METHOD OF MANUFACTURING THE SAME

BACKGROUND OF THE INVENTION

The present invention relates to a semiconductor device and a method of manufacturing the same.

In recent years, in keeping with a trend of implementing the semiconductor device in a miniaturized structure, there has arisen the requirement that the gate of a transistor be realized in a length of 0.15 µm with the film thickness of the gate insulation film being decreased to less than 2 nm when silicon oxide ($SiO_2$) is employed for the gate insulation film. In this conjunction, it is noted that such thickness of the gate insulation film as mentioned above will give rise to occurrence of a tunnel current of unignorable magnitude. To cope with this problem, it has been attempted to increase the physical film thickness while maintaining the desired dielectric characteristic by using an insulation material exhibiting higher dielectric constant (or permittivity) than $SiO_2$.

As a candidate for such high dielectric constant material, there may be mentioned titanium oxide, as is reported in the collection of lecture reprints of "THE 1999 INTERNATIONAL CONFERENCE ON SOLID STATE DEVICES AND MATERIALS", pp. 164–165.

However, in the present state of the art, when the semiconductor device is formed by using titanium oxide for the gate insulation film in actuality, a leak current will flow through the gate insulation film of titanium oxide, degrading the reliability of the semiconductor device. Such being the circumstances, there exists a demand for practical implementation of the semiconductor device in which the occurrence of the leak current is suppressed by increasing the physical film thickness while maintaining the dielectric characteristic.

SUMMARY OF THE INVENTION

An object of the present invention to provide a semiconductor device in which the occurrence of leak current is suppressed by increasing the physical film thickness while maintaining the dielectric characteristic and a method of manufacturing the same.

The inventors of the present application have made studies for making clear the causes for occurrence of leak current in the semiconductor devices and found that one of the major causes for the leak current resides in that silicon elements of the gate electrode formed of e.g. polycrystalline silicon diffuse into the titanium oxide film upon heat treatment in the course of manufacturing process.

Further, it has been discovered that the diffusion mentioned above is more likely to take place as the temperature for heat treatment is higher and makes appearance more remarkably in memory products in which a capacitor insulation film exhibiting a high dielectric constant (high permittivity) or ferroelectricity and which undergo heat treatment at higher temperature although the diffusion phenomenon is certainly observed in the logic LSI devices as well.

Furthermore, the inventors of the present application have discovered that use of ruthenium oxide or iridium oxide as the gate electrode material to be formed in contact with titanium oxide is effective for suppressing the occurrence of current leakage mentioned above as a result of strenuous studies for finding out the means for preventing diffusion of conductive elements into the gate insulation film formed of titanium oxide from the gate electrode. At this juncture, it should be mentioned that silicon element and metal elements are herein also referred to as the conductive element(s) only for the convenience of description.

Still further advantages of the present invention will become apparent to those of ordinarily skill in the art upon reading and understanding the following detailed description of the preferred and alternate embodiments.

BRIEF DESCRIPTION OF THE DRAWINGS

The invention will be described in conjunction with certain drawings which are for the purpose of illustrating the preferred and alternate embodiments of the invention only, and not for the purpose of limiting the same, and wherein.

DESCRIPTION OF THE EMBODIMENTS

Figure 1:
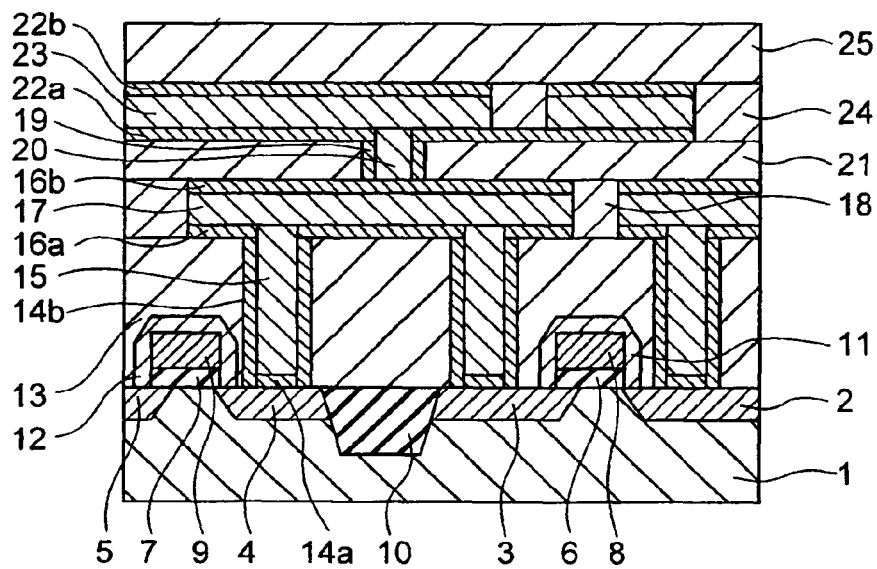
FIG. 1 is a sectional view showing generally and schematically a structure of a major portion of a semiconductor device according to a first embodiment of the present invention.

For achieving the object mentioned previously, the teachings of the present invention are incarnated in the embodiments enumerated below.

(1) A semiconductor device includes a semiconductor substrate, a gate insulation film formed on one major surface of the semiconductor substrate and containing titanium oxide as a primary constituent material, and a gate electrode film formed in contact with the gate insulation film and containing ruthenium oxide or alternatively iridium oxide as a primary constituent material.

(2) In the semiconductor device set forth in the above paragraph (1), film thickness of the gate insulation film and the gate electrode film is preferably greater than 0.9 nm inclusive.

(3) In the semiconductor device set forth in the above paragraph (1) or (2), titanium oxide is preferably in the form of a crystal of rutile structure.

(4) A semiconductor device includes a semiconductor substrate, a gate insulation film formed on one major surface of the semiconductor substrate and containing titanium oxide as a primary constituent material, and a gate electrode film formed in contact with the gate insulation film, wherein the gate electrode film is constituted by a laminated film which is composed of an electrically conductive oxide film containing ruthenium oxide or alternatively iridium oxide as a primary constituent material and an electrically conductive film containing a metal as a primary constituent material.

(5) Further, in the semiconductor device set forth in the above paragraph (4), film thickness of the gate insulation film and the electrically conductive oxide film are preferably greater than 0.9 nm inclusive.

(6) In the semiconductor device set forth in the above paragraph (4) or (5), titanium oxide is preferably in the form of a crystal of rutile structure.

(7) Furthermore, in the semiconductor device set forth in the above paragraph (4), (5) or (6), the metal is preferably ruthenium or alternatively iridium.

(8) A semiconductor device includes a semiconductor substrate, a gate insulation film formed on one major surface of the semiconductor substrate and containing titanium oxide as a primary constituent material, a gate electrode film formed in contact with the gate insulation film and constituted by a laminated film which is composed of an electrically conductive oxide film containing ruthenium oxide or alternatively iridium oxide as a primary constituent material and an electrically conductive film containing a metal as a primary constituent material, a first capacitor electrode formed on the one major surface of the semiconductor substrate, a capacitor insulation film formed in contact with the first capacitor electrode and exhibiting a high dielectric constant or alternatively ferroelectricity, and a second capacitor electrode formed in contact with the capacitor insulation film.

(9) Further, in the semiconductor device set forth in the above paragraph (8), film thickness of the insulation film and the electrically conductive oxide film are preferably greater than 0.9 nm inclusive.

(10) In the semiconductor device set forth in the above paragraph (8), titanium oxide is preferably in the form of a crystal of rutile structure.

(11) Furthermore, in the semiconductor device set forth in the above paragraph (8), the metal is preferably ruthenium or alternatively iridium.

(12) A semiconductor device includes a semiconductor substrate, a gate insulation film composed of a first gate insulation film formed on one major surface of the semiconductor substrate and containing titanium oxide and titanium silicate as primary constituent materials and a second gate insulation film formed on the one major surface and containing titanium oxide as a primary constituent material, and a gate electrode film formed in contact with the gate insulation film and containing ruthenium oxide or alternatively iridium oxide as a primary constituent material.

(13) A semiconductor device includes a semiconductor substrate, a gate insulation film composed of a first gate insulation film formed on one major surface of the semiconductor substrate and containing titanium oxide and titanium silicate as primary constituent materials and a second gate insulation film formed on the one major surface and containing titanium oxide as a primary constituent material, and a gate electrode composed of a first gate electrode film formed in contact with the gate insulation film and containing ruthenium oxide or alternatively iridium oxide as a primary constituent material and a second gate electrode film formed in contact with the gate insulation film and containing one selected from a group consisting of ruthenium, iridium, platinum, tungsten and molybdenum as a primary constituent material.

(14) A method of manufacturing a semiconductor device includes the steps of forming a gate insulation film containing titanium oxide as a primary constituent material on one major surface of a semiconductor substrate, and depositing on the gate insulation film a conductor film containing ruthenium or alternatively iridium as a primary constituent material to thereby form a gate electrode film.

(15) A method of manufacturing a semiconductor device includes the steps of forming a gate insulation film containing titanium oxide as a primary constituent material on one major surface of a semiconductor substrate, depositing on the gate insulation film a conductor film containing ruthenium or alternatively iridium as a primary constituent material to thereby form a gate electrode film, forming a first capacitor electrode, forming a capacitor insulation film having high dielectric constant or ferroelectricity in contact with the silicon first capacitor electrode, and forming a second capacitor electrode in contact with the capacitor insulation film.

In the following, typical embodiments of the present invention will be described in detail by reference to the drawings. FIG. 1 is a sectional view showing schematically a structure of a major portion in the semiconductor device according to a first embodiment of the present invention.

Referring to FIG. 1, the semiconductor device according to the first embodiment of the invention is implemented in a structure of the MOS transistor. In this semiconductor device, diffusion layers 2, 3, 4 and 5 are formed on a silicon substrate 1, and gate insulation films 6 and 7 and gate electrodes 8 and 9 are deposited on these diffusion layers.

With a view to satisfying the requirement for miniaturization and high performance, titanium oxide is used as a primary constituent material for forming the gate insulation films 6 and 7. These gate insulation films 6 and 7 may be deposited by resorting to, for example, a chemical vapor deposition process, a sputtering process or the like.

Further, ruthenium oxide or iridium oxide is employed as a primary constituent material for forming the gate electrodes 8 and 9 because ruthenium oxide and iridium oxide are unfavorable to the diffusion of the conductive elements into the gate insulation films 6 and 7 upon heat treatment which is one of the processes for manufacturing the device. Incidentally, with the phrase "primary constituent material" of a member or a part, it is intended to mean a material which occupies a ratio of 50% or more in the composition of that member or part.

These gate electrodes 8 and 9 may be formed by resorting to, for example, a chemical vapor deposition process, a sputtering process or the like. The MOS transistors are separated from one another by using, for example, an element separation film 10 constituted by a silicon oxide film.

Further, insulation films 11 and 12 each constituted by e.g. a silicon oxide film are formed on top surfaces and side wall surfaces of the gate electrodes 8 and 9, respectively. Formed over the whole top surface of the MOS transistor is an insulation film 13 which may be constituted by e.g. a BPSG (Boron-Doped Phosphor Silicate Glass) film, an SOG (Spin-On-Glass) film or alternatively a silicon oxide film or a nitride film formed through the chemical vapor deposition process or sputtering process.

Formed in each of contact holes pierced through the insulation film 13 is a plug composed of a main conductor film 15 which is coated with adjacent conductor films (first conductor films) 14a and 14b for the purpose of preventing the diffusion, wherein the plugs are connected to the diffusion layers 2, 3, 4 and 5, respectively.

Through the medium of the plug constituted by the main conductor film 15, first laminated wiring conductors each composed of a main conductor film 17 coated with adjacent conductor films 16a and 16b for preventing the diffusion are connected to the diffusion layers 2, 3, 4 and 5. The first laminated wiring conductor can be implemented by forming a wiring pattern by etching the adjacent conductor film 16b formed through a sputtering process or the like on the main conductor film 17 also formed by a sputtering process or the like after depositing the adjacent conductor film 16a by a sputtering process. The respective main conductor films 17 are separated electrically by insulating films 18.

Formed on the first laminated wiring conductor is a plug composed of a main conductor film 20 coated with an adjacent conductor film 19 in the contact hole formed in an insulation film 21, which plug is connected to the first laminated wiring conductor.

Through the medium of the plug constituted by the main conductor film 20, a second laminated wiring conductor constituted by a main conductor film 23 coated with adjacent conductor films 22a and 22b is connected to the first laminated wiring conductor.

The second laminated wiring conductor constituted by the main conductor film 23 may be implemented by forming a wiring pattern by etching the adjacent conductor film 22b formed by a sputtering process or the like on the main conductor film 23 also formed by a sputtering process after depositing the adjacent conductor film 22a by s sputtering process. After wirings are formed, insulating films 24 and 25 are formed.

In the semiconductor device according to the first embodiment of the present invention, ruthenium oxide or iridium oxide is employed as a primary constituent material for forming the gate electrodes 8 and 9 because ruthenium oxide and iridium oxide are unfavorable to the diffusion of the conductive elements into titanium oxide. By virtue of this feature, leak current which will otherwise take place due to the diffusion of elements into the gate insulation films 6 and 7 upon heat treatment can advantageously be suppressed.

In conjunction with the diffusion of elements into titanium oxide, the advantageous effects attained with the semiconductor device according to the first embodiment of the present invention will be described below by comparing ruthenium oxide and iridium oxide employed in the first embodiment of the invention with polycrystalline silicon, tungsten, tungsten silicide, molybdenum, molybdenum silicide, titanium and titanium nitride which have heretofore been examined as the gate insulation film material.

For elucidating the effects obtained with the first embodiment of the present invention, analytical examples based on the molecular dynamics simulation are given below.

According to the molecular dynamics simulation, forces acting on individual atoms are calculated on the basis of interatomic potentials, whereon the Newton's equation of motion is solved for these forces to thereby calculate the positions of the atoms at discrete time points, as is described, for example, in "JOURNAL OF APPLIED PHYSICS", Vol. 54, pp. 4864–4878 (1983). Incidentally, in the first embodiment of the present invention, relations described below could be determined by calculating the interactions among heterogeneous elements by taking into consideration the charge migration in the molecular dynamics method.

A major effect obtained with the first embodiment of the present invention can be seen in that the diffusion of elements into the gate insulation film from the gate electrode can be suppressed. Accordingly, by calculating the diffusion coefficients of conductive elements diffusing into the gate insulation film and comparing the diffusion coefficients, the effect obtained with the first embodiment of the present invention can analytically be determined.

The method of calculating the diffusion coefficient through the molecular dynamics simulation is described, for example, in "PHYSICAL REVIEW B", Vol. 29, pp. 5363 to 5371 (1984).

In the first place, the effect obtained with the first embodiment of the present invention will be elucidated in conjunction with calculational examples of the diffusion coefficients in the device of a structure in which the gate electrode film of 3 nm in film thickness and the gate insulation film of 3 nm in film thickness are stacked or laminated.

As the gate insulation film, a titanium oxide film of rutile structure or anatase structure was used while as the gate electrode material, there were employed polycrystalline silicon, tungsten, tungsten silicide, molybdenum, molybdenum silicide, titanium and titanium nitride which have heretofore been examined as the gate insulation film material and ruthenium oxide and iridium oxide used in the first embodiment of the present invention.

Figure 2:
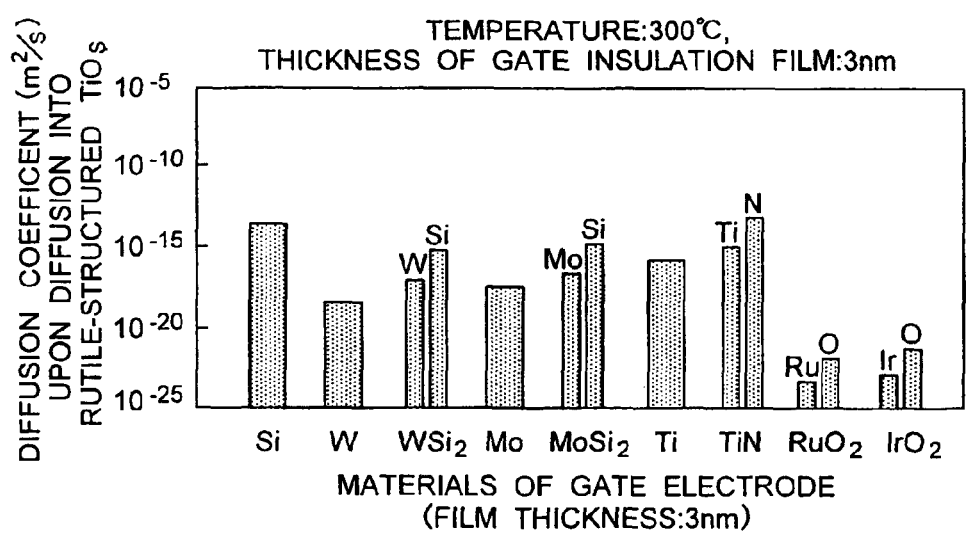
FIG. 2 is a view for graphically illustrating diffusion coefficients of constituent elements of a gate electrode of 3 nm in thickness diffusing into a titanium oxide film of rutile structure of 3 nm in thickness at 300° C. in the device according to the first embodiment of the invention.

FIG. 2 is a view for graphically illustrating the results of calculation of the diffusion coefficients of elements of the gate electrode diffusing into the titanium oxide film of rutile structure at 300° C. Further, FIG. 3 is a view for graphically illustrating the results of calculation of the diffusion coefficients at 600° C.

Figure 3:
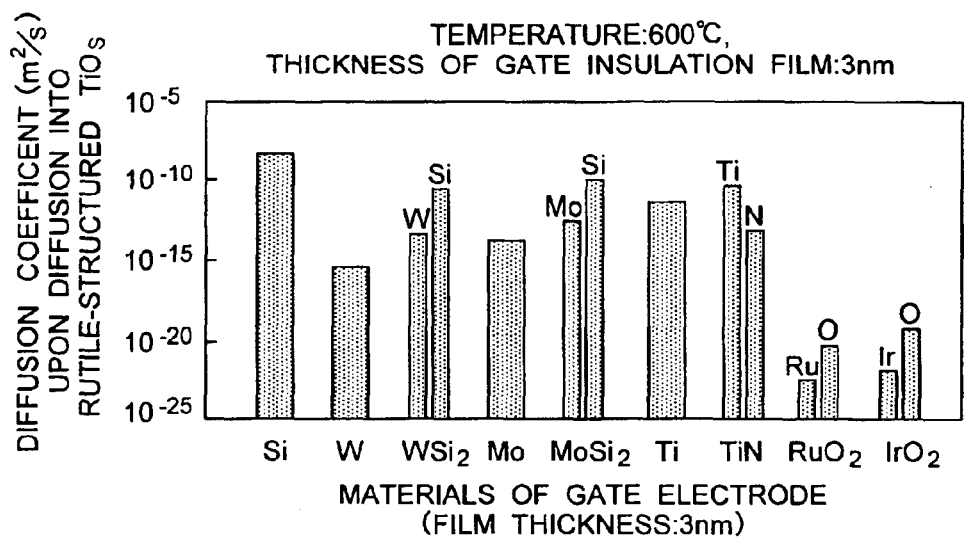
FIG. 3 is a view for graphically illustrating diffusion coefficients of constituent elements of a gate electrode of 3 nm in thickness diffusing into a titanium oxide film of rutile structure of 3 nm in thickness at 600° C. in the device according to the first embodiment of the invention.

From FIGS. 2 and 3, it can be seen that the diffusion coefficient is small in the case where ruthenium oxide or iridium oxide is employed for forming the gate electrode either at 300° C. or 600° C., when compare with the other materials.

Namely, it can be said that in the case where ruthenium oxide or iridium oxide is used as the gate electrode, elements of the gate electrode are difficult to enter or diffuse into the gate insulation film, ensuring thus enhanced reliability.

Shown in FIGS. 2 and 3 are the results of calculation for the exemplary case where titanium oxide of the rutile structure is used. On the other hand, the results of calculation of the diffusion coefficients for the exemplary case where titanium oxide of anatase structure is used are shown in FIGS. 4 and 5.

Figure 4:
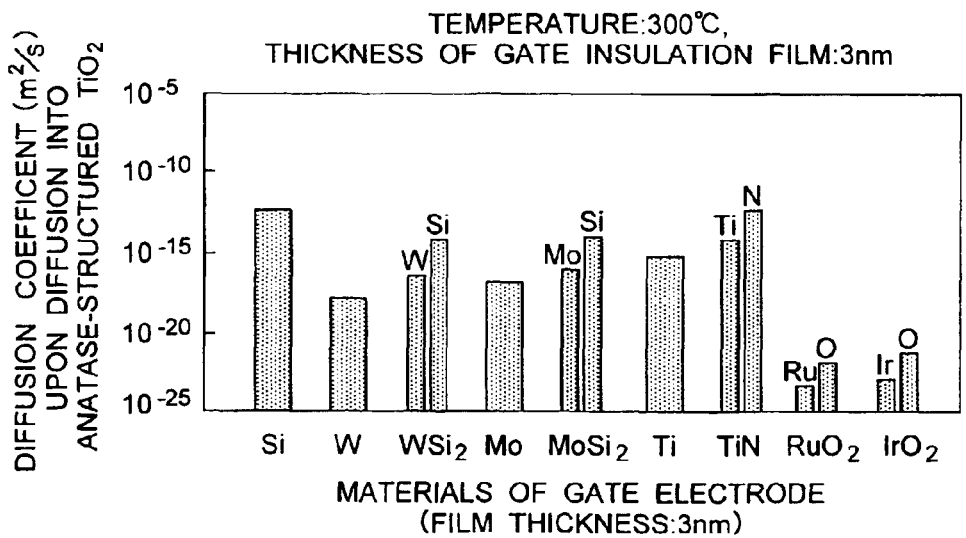
FIG. 4 is a view for graphically illustrating diffusion coefficients of constituent elements of a gate electrode of 3 nm in thickness diffusing into a titanium oxide film of anatase structure of 3 nm in thickness at 300° C. in the device according to the first embodiment of the invention.
Figure 5:
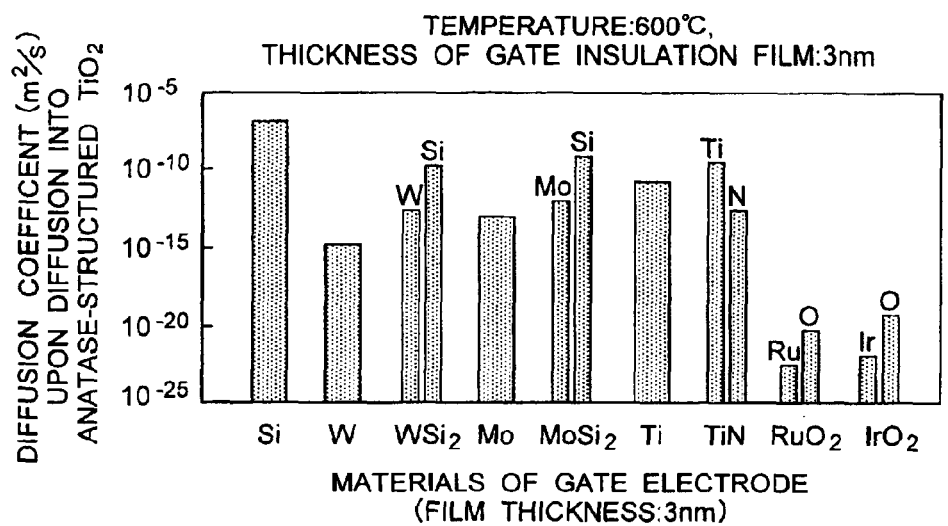
FIG. 5 is a view for graphically illustrating diffusion coefficients of constituent elements of a gate electrode of 3 nm in thickness diffusing into a titanium oxide film of anatase structure of 3 nm in thickness at 600° C. in the device according to the first embodiment of the invention.

More specifically, FIGS. 4 and 5 are views for graphically illustrating the results of calculation of the diffusion coefficients at 300° C. and 600° C., respectively. It can also be seen from FIGS. 4 and 5 that in the case where titanium oxide of anatase structure is used, the gate electrode of ruthenium oxide or iridium oxide exhibits smaller diffusion coefficient when compared with the other cases, similarly to the examples shown in FIGS. 2 and 3.

Comparison of the results of calculation illustrated in FIGS. 2 and 3 with the results of calculation illustrated in FIGS. 4 and 5 shows that smaller diffusion coefficient can be obtained in the case where titanium oxide of rutile structure is employed when compared with the case where titanium oxide of anatase structure is employed. Accordingly, it is preferred to employ titanium oxide of rutile structure for the gate insulation film while ruthenium oxide or iridium oxide being employed for the gate electrode.

The gate insulation film of titanium oxide of rutile structure may be formed at a high temperature or deposited at a low temperature to be subsequently subjected to heat treatment, as is described, for example, in "IBM JOURNAL OF RESEARCH AND DEVELOPMENT", Vol. 43, No. 3 (May, 1999), pp. 383 to 391.

The examples shown in FIGS. 2, 3, 4 and 5 represent the results of calculation performed on the presumption that the film thickness of the gate insulation film and the gate electrode film, respectively, is 3 nm. In this conjunction, dependency of the diffusion coefficient on the film thickness has also been examined with the film thickness being changed, the results of which will be described below.

Figure 6:
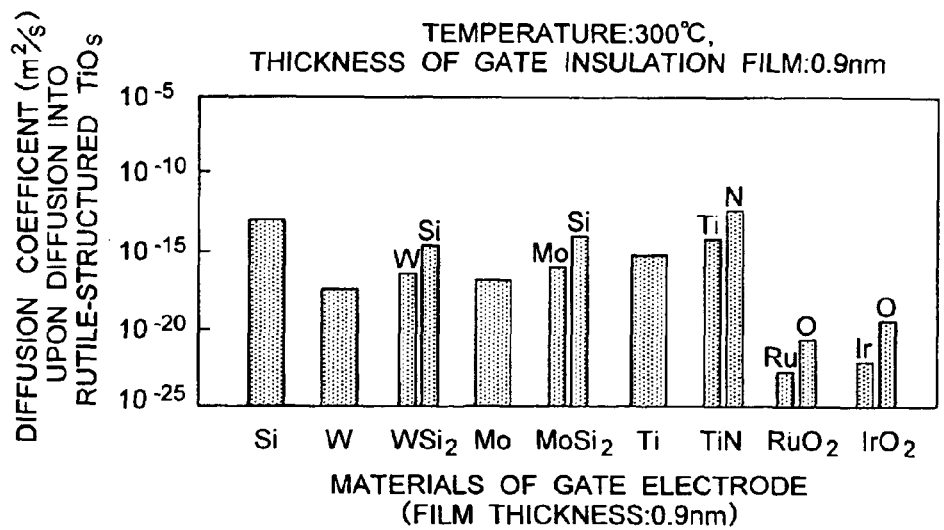
FIG. 6 is a view for graphically illustrating diffusion coefficients of constituent elements of a gate electrode of 0.9 nm in thickness diffusing into a titanium oxide film of rutile structure of 0.9 nm in thickness at 300° C. in the device according to the first embodiment of the invention.
Figure 7:
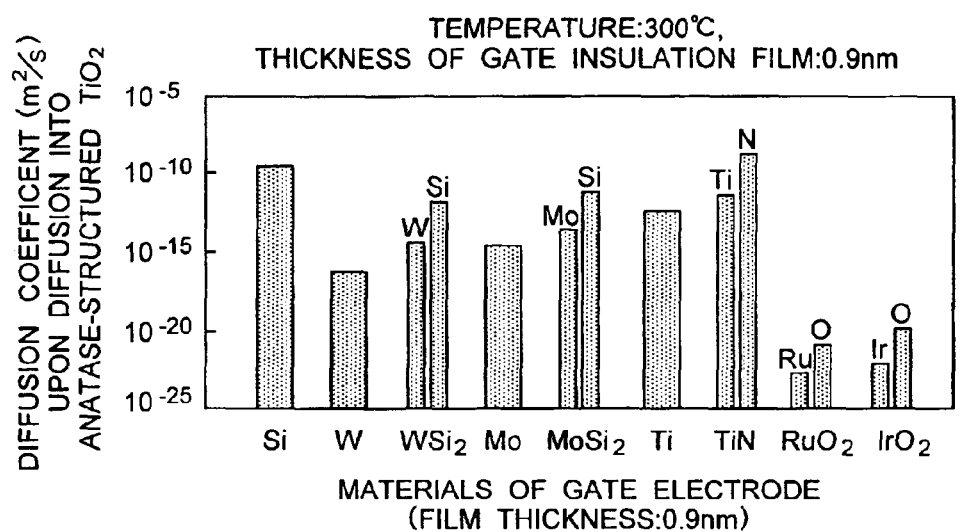
FIG. 7 is a view for graphically illustrating diffusion coefficients of constituent elements of a gate electrode of 0.9 nm in thickness diffusing into a titanium oxide film of anatase structure of 0.9 nm in thickness at 300° C. in the device according to the first embodiment of the invention.

FIGS. 6 and 7 are views showing graphically results of calculations made on the presumption that the film thickness of both the gate insulation film and the gate electrode film is 0.9 nm and that the temperature is 300° C., wherein FIG. 6 shows the case where the gate insulation film is formed of titanium oxide of rutile structure while FIG. 7 shows for case where the gate insulation film is formed of titanium oxide of anatase structure.

As can be seen from FIGS. 6 and 7, even when the film thickness is thinned down to 0.9 nm, the diffusion coefficients for ruthenium oxide and iridium oxide are significantly small when compared with the others, as in the case where the film thickness is 3 nm.

Furthermore, in the case where the temperature is 600° C., the results of calculation shows that the diffusion coefficients for ruthenium oxide and iridium oxide are significantly small when compared with the others, although not shown in the drawing.

Figure 8:
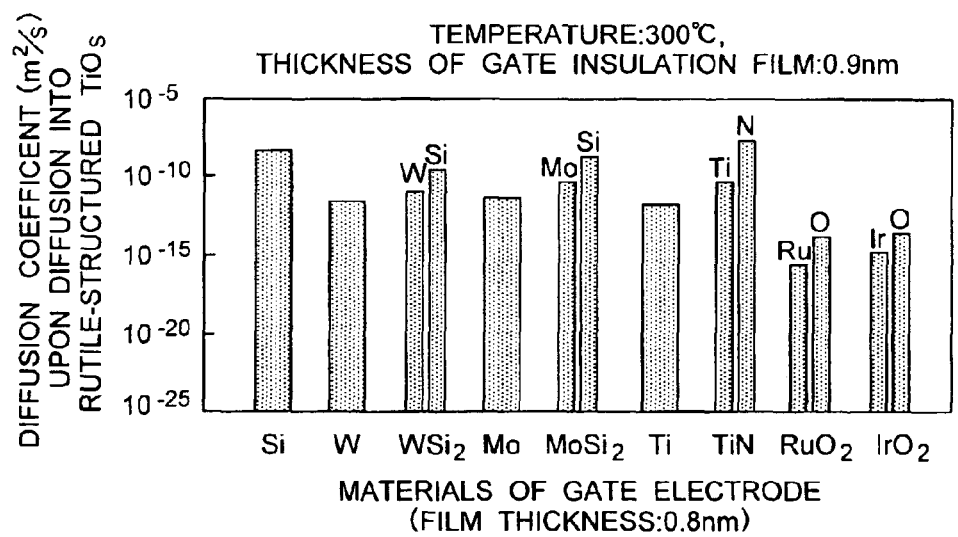
FIG. 8 is a view for graphically illustrating diffusion coefficients of constituent elements of a gate electrode of 0.8 nm in thickness diffusing into a titanium oxide film of rutile structure of 0.9 nm in thickness at 300° C. in the device according to the first embodiment of the invention.

By contrast, FIG. 8 graphically shows the results of calculation for the rutile structure at 300° C. in the case where the thickness of the gate electrode film is 0.8 nm with the film thickness of the gate insulation film being 0.9 nm.

In the case of the example shown in FIG. 8, diffusion coefficients of ruthenium oxide and iridium oxide increase remarkably as compared with the examples shown in FIGS. 6 and 7, indicating that the effect intended with the first embodiment of the present invention can not sufficiently be attained.

Accordingly, the film thickness of ruthenium oxide or iridium oxide should preferably be greater than 0.9 nm inclusive.

Figure 9:
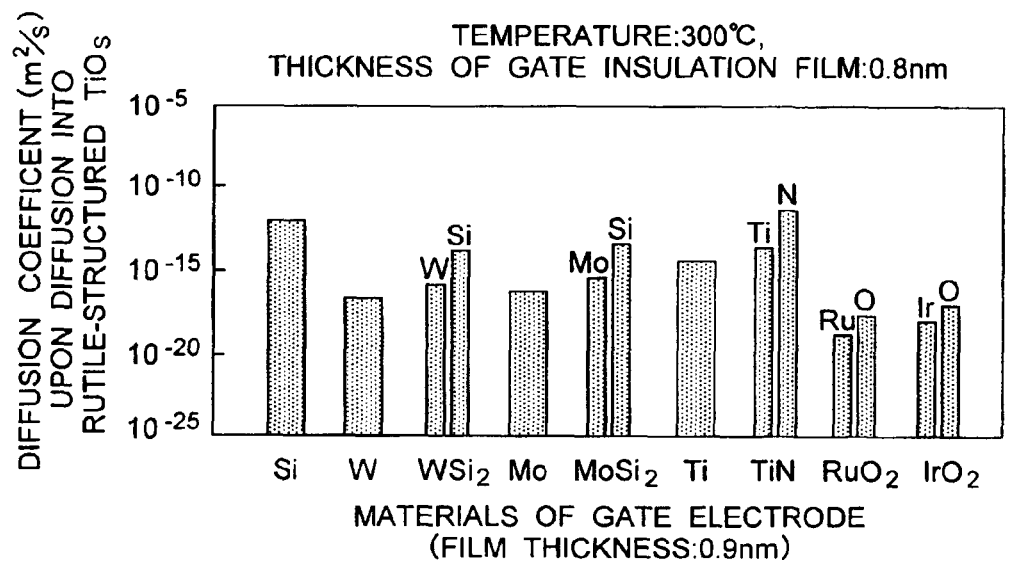
FIG. 9 is a view for graphically illustrating diffusion coefficients of constituent elements of a gate electrode of 0.9 nm in thickness diffusing into a titanium oxide film of rutile structure of 0.8 nm in thickness at 300° C. in the device according to the first embodiment of the invention.

Next, FIG. 9 graphically shows the results of calculation for the rutile structure at 300° C. in the case where the thickness of the gate insulation film is 0.8 nm with the film thickness of the gate electrode film being of 0.9 nm. Also in the case of the example shown in FIG. 9, diffusion coefficients of ruthenium oxide and iridium oxide increase remarkably when compared with the examples shown in FIGS. 6 and 7, indicating that the effect aimed with the first embodiment of the present invention can not sufficiently be realized.

Under the circumstances, the film thickness of titanium oxide should preferably be greater than 0.9 nm as well. The examples shown in FIGS. 8 and 9 are for the rutile structure. It should however be added that the result of calculation for the anatase structure also shows that the film thickness be preferably greater than 0.9 nm inclusive. The reason why the intended effect is insufficient with the film thickness of less than 0.8 nm may be explained by the fact that the crystal structures of ruthenium oxide, iridium oxide and titanium oxide becomes instable more or less.

As is apparent from the foregoing, with the teachings of the present invention incarnated in the first embodiment, there can be realized the semiconductor device in which occurrence of the leak current can positively be suppressed by increasing the physical film thickness while ensuring the dielectric characteristic by virtue of the feature that the gate electrodes 8 and 9 are implemented by using as the primary constituent material ruthenium oxide and iridium oxide with which diffusion into titanium oxide is difficult to occur.

Figure 10:
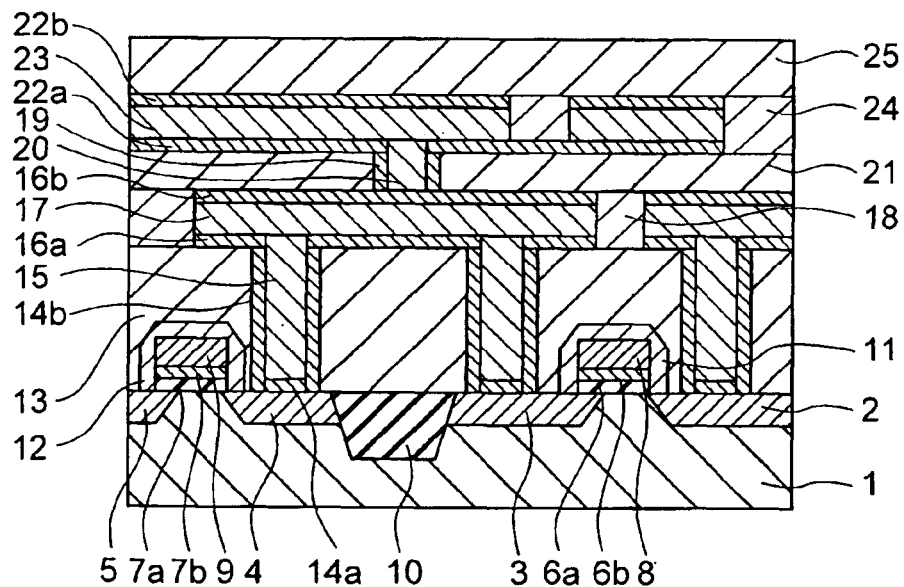
FIG. 10 is a sectional view showing generally and schematically a structure of a major portion of a semiconductor device according to a second embodiment of the present invention.

Next, a semiconductor device according to a second embodiment of the present invention will be described by reference to FIG. 10 which shows a sectional structure of a major portion of the semiconductor device according to the second embodiment of the invention.

The semiconductor device according to the instant embodiment of the invention differs from the first embodiment primarily in that the gate insulation film of the semiconductor device now under consideration is implemented in a two-layer structure including a first gate insulation film 6a; 7a and a second gate insulation film 6b; 7b.

With a view to satisfying the requirement for miniaturization and high performance, titanium oxide is employed as a primary constituent material for forming the second gate insulation films 6b and 7b. The first gate insulation films 6a and 7a are formed of e.g. silicon oxide or titanium silicate as the primary constituent material, as a result of which there can be obtained such effect that the thermal stability of the second gate insulation films 6b and 7b is improved.

Thus, with the second embodiment of the present invention, the effect that the thermal stability of the second gate insulation films 6b and 7b is enhanced can be obtained in addition to the effects similar to those mentioned previously in conjunction with the first embodiment of the invention. At this juncture, it should also be mentioned that the gate insulation film may equally be implemented in a structure having three or more layers, although illustration thereof is omitted.

Figure 11:
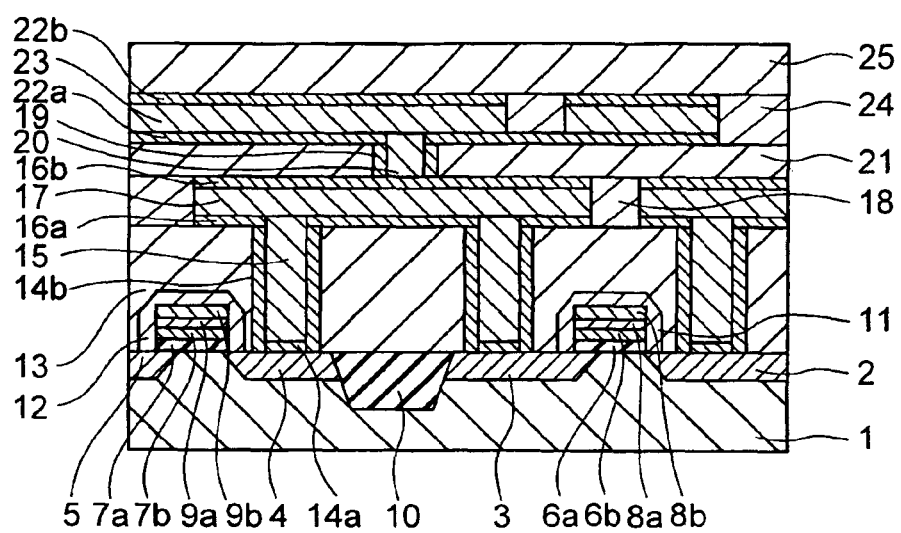
FIG. 11 is a sectional view showing generally and schematically a structure of a major portion of a semiconductor device according to a third embodiment of the present invention.

Next, a semiconductor device according to a third embodiment of the present invention will be described by reference to FIG. 11 which shows a sectional structure of a major portion of the semiconductor device according to the third embodiment of the invention. The semiconductor device according to the instant embodiment of the invention differs from the second embodiment primarily in that the gate electrode film of the semiconductor device now concerned is implemented in a two-layer structure including a first gate electrode film 8a; 9a and a second gate electrode film 8b; 9b.

As the primary constituent material of the first gate electrode films 8a and 9a, ruthenium oxide or iridium oxide is used with which conductive elements are difficult to diffuse into the second gate insulation film 6b; 7b upon heat treatment.

For the second gate electrode film 8b; 9b, a film containing as the primary constituent material one selected from a group consisting of e.g. ruthenium, iridium, platinum, tungsten and molybdenum is employed. Owing to this feature, there can be obtained such effect that the electric resistance of the gate electrode as a whole is decreased.

Thus, with the third embodiment of the present invention, there can be obtained such effect that the electric resistance of the gate electrode as a whole is decreased in addition to the effects similar to those mentioned previously in conjunction with the first embodiment of the invention.

Figure 12:
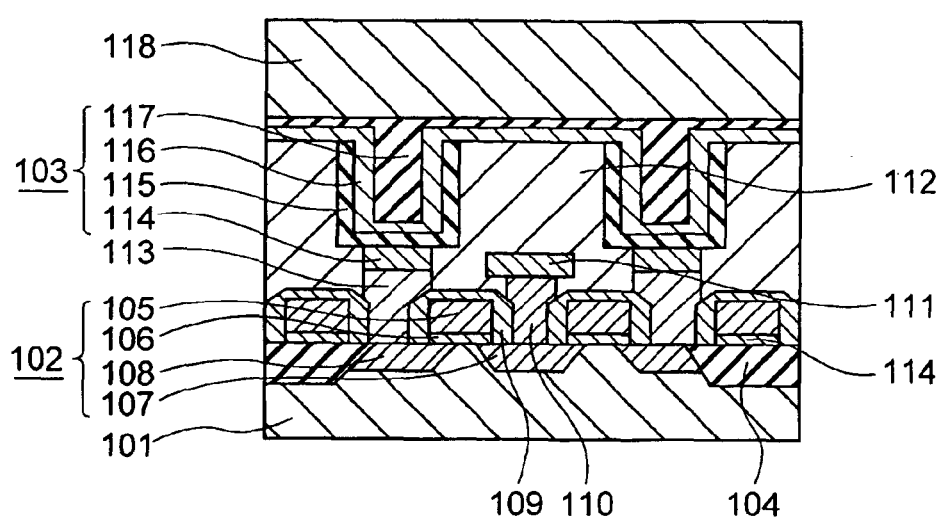
FIG. 12 is a sectional view showing generally and schematically a structure of a major portion of a semiconductor device according to a fourth embodiment of the present invention.

FIG. 12 is a view showing a sectional structure of a memory cell in the semiconductor device according to a fourth embodiment of the present invention. The instant embodiment differs from the first, second and third embodiments in that the semiconductor device now concerned includes a data storing capacitor element 103 implemented in a stacked or laminated structure including a conductive barrier film 114, a capacitor bottom electrode 115, an oxide film 116 exhibiting a high dielectric constant (high permittivity) or ferroelectricity and a capacitor top electrode 117.

As is known in the art, the oxide film 116 having the high dielectric constant (high permittivity) or ferroelectricity can not exhibit desired favorable characteristics unless it undergoes heat treatment. Thus, heat treatment at about 600° C. at the lowest and more preferably at about 700° C. or higher is required in the manufacturing process.

During the heat treatment mentioned above, elements are likely to enter or diffuse into the gate insulation film from the gate electrode film. Accordingly, in the case of the semiconductor memory in which the oxide film having a high dielectric constant or ferroelectricity is used, there arises the necessity of suppressing the diffusion more positively.

A major structure of the semiconductor device according to the fourth embodiment of the invention will be described below. As is shown in FIG. 12, the semiconductor device according to the instant embodiment of the invention includes a MOS (Metal Oxide Semiconductor) transistor 102 formed in an active region of a major surface of a silicon substrate 101 and a data storing capacitor element 103 disposed on the MOS (Metal Oxide Semiconductor) transistor 102.

An insulation film 112 serves as a film for inter-element separation. The MOS transistor 102 of the memory cell is composed of a gate electrode film 105, a gate insulation film 106 and diffusion films 107 and 108. Reference numeral 104 denotes an element separation film. With a view to satisfying the requirement for miniaturization and high performance, titanium oxide is employed as a primary constituent material for forming the gate insulation film 106.

The gate insulation film 106 mentioned above is formed by resorting to, for example, a chemical vapor deposition process, a sputtering process or the like. Incidentally, the gate insulation film 106 may be implemented in a multi-layer structure having, for example, two or more layers, as in the case of the second and third embodiments of the invention described hereinbefore.

As the primary constituent material for the gate electrode film 105, ruthenium oxide or iridium oxide is used because then the diffusion of conductive elements into the gate insulation film 106 is difficult to occur upon heat treatment. This gate electrode film 105 may be implemented in a multi-layer structure having two or more layers as describe previously in conjunction with the third embodiment of the invention.

The gate electrode film 105 can be formed by resorting to, for example, a chemical vapor deposition process, a sputtering process or the like. Further, an insulation film 109 of e.g. silicon oxide film is formed on the top and the side walls of the gate electrode film 105.

Connected to one diffusion film 107 of the memory cell selecting MOS transistor is a bit line 111 by way of a plug 110. Further formed over the whole top surface of the MOS transistor is an insulation film 112 which may be constituted, for example, by a BPSG (Boron-Doped Phosphor Silicate Glass) film, an SOG (Spin On Glass) film or a silicon oxide film, nitride film or the like formed through a chemical vapor deposition process or sputtering process.

Formed on the insulation film 112 which covers the MOS transistor is the data storing capacitor element 103 which is connected to the other diffusion layer 108 of the memory cell selecting MOS transistor by way of a plug 113 which may be constituted by e.g. polycrystalline silicon.

The data storing capacitor element 103 is implemented in a stacked or laminated structure in which a conductive barrier film 114, a capacitor bottom electrode 115, an oxide film 116 having a high dielectric constant (high permittivity) or ferroelectricity and a capacitor top electrode 117 stacked in this order as viewed from the bottom layer. The data storing capacitor element 103 is covered with an insulation film 118. With the fourth embodiment, effects similar to those mentioned hereinbefore in conjunction with the first embodiment can be obtained.

A fifth embodiment of the present invention is directed to a system LSI which includes a memory LSI described above in conjunction with the fourth embodiment of the invention and a logic LSI of the structure described hereinbefore in conjunction with the first to third embodiments of the invention, both the LSIs being mounted on one and the same structure. With the system LSI according to the fifth embodiment of the invention, there can be ensured the effects similar to those mentioned hereinbefore in conjunction with the first to third embodiments.

Now, a method of manufacturing the semiconductor device according to an embodiment of the present invention will be described. In a first step of the manufacturing method, the gate insulation film is formed of a composition containing titanium oxide as the primary constituent material on one major surface of a semiconductor substrate. Subsequently, in a second step, a conductor film is formed of a composition containing ruthenium or iridium as a primary constituent material on the above-mentioned gate insulation film, to thereby form a gate electrode film.

With the manufacturing method according to the instant embodiment, there can be realized a method of manufacturing the semiconductor device in which occurrence of the leak current can be suppressed because of the increased physical film thickness while ensuring the dielectric characteristic.

As other method of manufacturing the semiconductor device according to the present invention, the process mentioned below may be adopted.

In a first step of the other manufacturing method, the gate insulation film is formed of a composition containing titanium oxide as the primary constituent material on one major surface of a semiconductor substrate.

Subsequently, in a second step, a conductor film is formed of a composition containing ruthenium or iridium as a primary constituent material on the above-mentioned gate insulation film, to thereby form a gate electrode film.

In succession, a first capacitor electrode is formed in a third step which is then followed by a fourth step of forming a capacitor insulation film having a high dielectric constant (high permittivity) or ferroelectricity in contact with the first capacitor electrode mentioned above. Finally, in a fifth step, a second capacitor electrode is formed in contact with the capacitor insulation film mentioned above.

With the manufacturing method described just above, there can be realized the semiconductor device in which occurrence of the leak current can be suppressed because of the increased physical film thickness while ensuring the dielectric characteristic, similarly to the semiconductor device according to the first embodiment.

The present invention has thus provided the semiconductor devices in which occurrence of the leak current can be suppressed by increasing the physical film thickness while ensuring the dielectric characteristic. Further, the invention has provided the methods of manufacturing the same.

Further, there are provided the semiconductor device and the method of manufacturing the same which can enjoy high yield and enhanced manufacturing efficiency.

Moreover, there are provided the semiconductor device having a gate structure unlikely to incur the current leakage and the method of manufacturing the same.

What is claimed are:

1. A semiconductor device, comprising:

a semiconductor substrate;

a gate insulation film formed on one major surface of said semiconductor substrate and including titanium oxide; and a gate electrode film formed in contact with said gate insulation film, said gate electrode film having a dual function of being an electrode and a diffusion barrier, said gate electrode film being configured to minimize diffusion of conductive elements into said gate insulation film to reduce a current leakage via the gate insulation film, said gate electrode film including ruthenium oxide or iridium oxide, wherein said titanium oxide is in the form of a crystal of rutile structure, wherein said gate electrode film and titanium oxide cooperate to reduce the diffusion of conductive elements of said gate electrode into said gate insulation film, so that the diffusion of the conductive elements of said gate electrode is less than that of when said gate electrode comprises Si, W, WSi2, Mo, MoSi2, Ti, or TiN.

2. A semiconductor device, comprising:

a semiconductor substrate;

a gate insulation film formed on one major surface of said semiconductor substrate and including titanium oxide and having thickness of no more than 2 nm; and a gate electrode film including ruthenium oxide or iridium oxide and formed in contact with said gate insulation film, said gate electrode film having a dual function of being an electrode and a diffusion barrier, said gate electrode film of ruthenium or iridium oxide and being configured to cooperate with said gate insulation film including titanium oxide in suppressing diffusion of conductive elements into said gate insulation film and reduce a current leakage via the gate insulation film, wherein film thickness of said gate insulation film is greater than about 0.9 nm and less than about 2 nm, wherein said ruthenium oxide or iridium oxide being at least 50 percent in composition of said gate electrode film.

3. A semiconductor device, comprising:

a semiconductor substrate;

a gate oxide film formed on one major surface of said semiconductor substrate, said gate oxide film being titanium oxide and having a given crystal structure; and a gate electrode formed over said gate insulation film, said gate electrode including a conductive oxide layer and a metal layer, said conductive oxide layer being provided between said gate oxide film and said metal layer, wherein said gate oxide film is greater than about 0.9 nm and less than about 2 nm in thickness, wherein said conductive oxide layer includes ruthenium oxide or iridium oxide, and wherein thickness of said gate electrode is at least 0.9 nm.

4. A semiconductor device according to claim 3, wherein said titanium oxide has a rutile crystal structure.

5. A semiconductor device according to claim 3, wherein said metal layer includes ruthenium or iridium.

6. A semiconductor device, comprising:

a semiconductor substrate;

a titanium oxide gate insulation film formed on one major surface of said semiconductor substrate and being no more than about 2 nm in thickness;

a gate electrode including conductive oxide film and a metal film, said conductive oxide film including ruthenium or iridium oxide and being in contact with said gate oxide, said gate electrode including ruthenium or iridium oxide cooperating with the titanium oxide gate insulation film to suppress diffusion of an element from said gate electrode to said titanium oxide to reduce a current leakage via said titanium oxide film;

a first capacitor electrode formed on said one major surface of said semiconductor substrate;

a capacitor insulation film formed in contact with said first capacitor electrode and exhibiting a high dielectric constant or ferroelectricity; and a second capacitor electrode formed in contact with said capacitor insulation film, wherein said titanium oxide is provided with a given crystal structure, so that said titanium oxide cooperates with said gate electrode to reduce the diffusion of conductive elements of said gate electrode into said titanium oxide.

7. A semiconductor device according to claim 6, wherein thickness of said insulation film is at least about 0.9 nm and thickness of said conductive oxide film is at least about 0.9 nm.

8. A semiconductor device according to claim 6, wherein said titanium oxide has a rutile structure or anatase structure.

9. A semiconductor device according to claim 6, wherein said metal film includes ruthenium or iridium, said ruthenium or iridium comprising at least 50 percent of said metal film in composition.

10. A semiconductor device, comprising:

a semiconductor substrate;

a gate insulation structure including of a first gate insulation film formed over said semiconductor substrate and including silicon oxide or titanium silicate and a second gate insulation film formed over said first gate insulation film and including titanium oxide; and a gate electrode film formed in contact with said gate insulation structure and including ruthenium oxide or iridium oxide, wherein film thickness of said second gate insulation film is greater than about 0.9 nm and less than about 2 nm.

11. A semiconductor device, comprising:

a semiconductor substrate;

a gate insulation structure including a first gate insulation film and a second gate insulation film formed on said first gate insulation film and containing titanium oxide of a given crystal structure; and a gate electrode including a first gate electrode film formed in contact with said second gate insulation film and containing ruthenium oxide or iridium oxide and a second gate electrode film containing one selected from a group consisting of ruthenium, iridium, platinum, tungsten and molybdenum, wherein said given crystal structure of said titanium oxide and said first gate electrode film configured to inhibit diffusion of an element into said gate insulation structure, wherein film thickness of said gate insulation film is greater than about 0.9 nm and less than about 3 nm.

* * * * *